United States Patent [19]

Suzuki

[11] 4,156,823
[45] May 29, 1979

[54] METHOD FOR DAMPING AN ULTRASONIC TRANSDUCER

[76] Inventor: Hideyuki Suzuki, 360 Wada-cho, Hamamatsu-shi, Shizuoka-ken, Japan

[21] Appl. No.: 881,678

[22] Filed: Feb. 27, 1978

[30] Foreign Application Priority Data

May 6, 1977 [JP] Japan .................................. 52-51849
May 6, 1977 [JP] Japan .................................. 52-51850

[51] Int. Cl.² .......................................... H01L 41/10
[52] U.S. Cl. .................................... 310/317; 310/319; 73/584
[58] Field of Search ............... 310/314, 316, 317, 318, 310/319, 26; 340/10, 15, 3 A, 5 R; 318/116, 118; 181/106, 108, 123, 139, 142; 73/552, 584, 596, 598, 609, 627, 629

[56] References Cited

U.S. PATENT DOCUMENTS

| 2,416,337 | 2/1947 | Mason ............................... 310/317 X |
| 3,409,787 | 11/1968 | Agalides et al. ..................... 310/316 |
| 3,532,911 | 10/1970 | Roberts et al. .................. 310/317 X |
| 3,601,712 | 8/1971 | Elazar ............................... 310/319 X |
| 3,903,733 | 9/1975 | Murayama ....................... 310/319 X |

*Primary Examiner*—Mark O. Budd
*Attorney, Agent, or Firm*—Spencer & Kaye

[57] ABSTRACT

In an ultrasonic wave generator or receiver using an ultrasonic wave transducer, a negative immittance converter is inserted in a circuit of the generator or receiver in order to cancel components which impede the damping characteristics of the ultrasonic transducer.

4 Claims, 18 Drawing Figures

METHOD FOR DAMPING AN ULTRASONIC TRANSDUCER

This invention relates to a method for damping an ultrasonic transducer, for driving the ultrasonic transducer to generate an ultrasonic wave and for receiving an ultrasonic wave.

When an ultrasonic transducer (hereinafter referred to as "transducer"), is driven by electric energy, in particular when it is driven pulsewise for the purpose of measuring, etc., its response is liable to be delayed because the Q of the transducer is high, or because the transducer has a damping impedance. This delay is objectionable. In order to improve the response characteristics of the ultrasonic wave output, mechanical damping has been used. This mechanical damping is relatively effective in a frequency range of more than several hundred KHz, but less effective in the range below 100 KHz.

Similarly, when the transducer is used for receiving ultrasonic wave energy, in particular in the case of receiving pulsewise energy, due to the high Q of the transducer or existence of a transducer damping impedance, the receiver response is liable to be delayed, which is objectionable when the receiver is being used to make measurements.

According to the conventional methods, mechanical damping is applied to the transducer, or a damping resistor adjusted to the characteristics of the transducer is connected thereto, in order to improve the response characteristics. In the former mechanical damping method, a relatively good result is obtained in a relatively high frequency range of more than several hundred KHz. On the other hand, in the frequency range of less than 100KHz a sufficient damping effect may not be obtained. Also, according to all of these conventional methods, the receiving sensitivity of the receiver is decreased.

One of the objects of this invention is therefore to provide a method for damping an ultrasonic transducer used in an ultrasonic wave transmitter for measuring, which has a good response when being used without using any mechanical damping method.

Another object of this invention is to provide a method of receiving an ultrasonic wave having good receiving response and sensitivity without using any mechanical damping method.

In order to attain the above first object of this invention, in an ultrasonic wave transmitter comprising a signal generator, an amplifier for amplifying the output of the signal generator, and an ultrasonic transducer driven by the amplifier; an ultrasonic wave transmitter according to the present invention includes a negative immittance converter between the amplifier and the ultrasonic transducer. By means of the negative immittance generated by the negative immittance converter, the output impedance of the amplifier, the damping impedance of the ultrasonic transducer and the connecting impedance between the amplifier and the ultrasonic transducer are cancelled.

In order to attain the above second object, a negative immittance converter is inserted between the ultrasonic transducer and a pre-signal amplifier of an ultrasonic wave receiver. Thus, a negative immittance is generated to cancel the damping impedance of the ultrasonic transducer, a input impedance of the pre-signal amplifier and the connecting impedance between the pre-signal amplifier and the ultrasonic transducer.

A more complete understanding of this invention will be obtained from the detailed description, which follows, taken in conjunction with the appended drawings, wherein.

In the drawings, the same reference numerals and marks are used for identical parts.

First of all, an explanation will be given as to the case of driving an ultrasonic transducer, using FIGS. 1 through 9.

The numeral 1 denotes a driving signal generator, whose output is amplified by a driving amplifier 2. An ultrasonic transducer 3 is driven by the amplifier 2. The numeral 4 in FIG. 2 denotes a negative immittance converting circuit.

Figure 3:
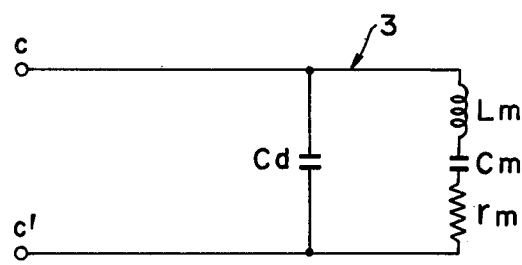
FIG. 3 is an equivalent circuit diagram of a transducer of the electro-strictive type used in the transmitter.

In FIG. 3, Cd is the damping capacitance; Lm is the equivalent inductance; Cm is the equivalent capacitance; and rm is the equivalent resistance of the transducer 3. When the equivalent mass of the transducer 3 is M; the equivalent stiffness thereof is S; the equivalent mechanical resistance of the transducer 3 including the acoustic radiation resistance is RM; and the force factor of the transducer 3 is A; Lm, Cm and rm are defined respectively by the following definitions:

Lm≡M/A²
Cm≡A²/S
rm≡RM/A².

Figure 4:
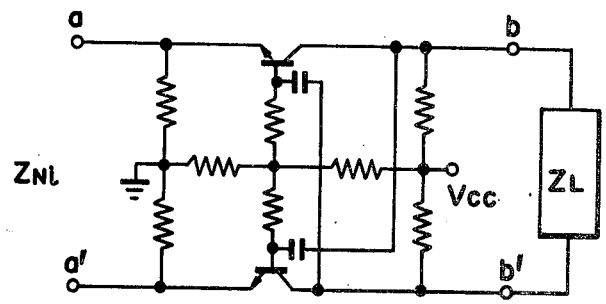
FIG. 4 is a circuit diagram of an example of a negative immmittance converter.

In FIG. 4, when the input impedance at the side of terminals a, a' is ZNi and the impedance connected between terminals b, b' is ZL, the following relation is valid between them:

$$ZNi = -KZL \quad (1)$$

In this case, K is a positive constant determined by the circuit constant of the negative immittance converting circuit 4. It is known that negative immittance converting circuits are classified into two types, the open circuit stable type and the short circuit stable type. The negative immittance converting circuit 4 in FIG. 4 of the present invention belongs to the former type.

Figure 5:
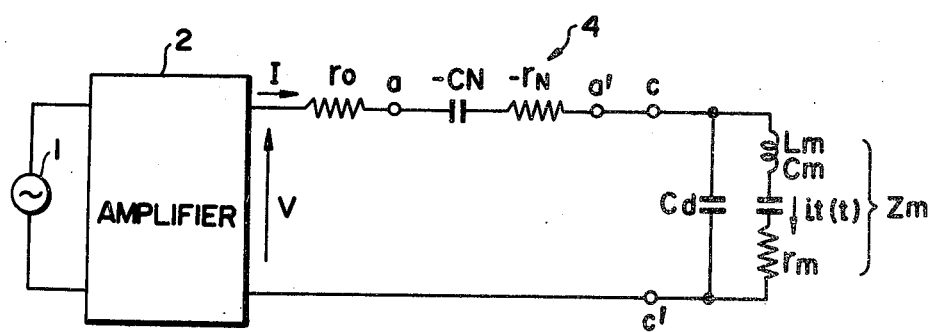
FIG. 5 is an equivalent circuit diagram showing the transmitter according to the present invention being driven.

The dampening effect obtained with the present method will be explained hereinafter. In the model of FIG. 5, the following basic equations of electromechanical conversion are valid:

$$\left. \begin{array}{l} F = -AV + A^2/Ym \cdot \dot{v} \\ I = (Y'O + Yd)V + A\dot{v} \end{array} \right\} \quad (2).$$

In FIG. 5, V is the output voltage of the amplifier 2; I is the output current of the amplifier 2; and ro is the output impedance thereof. The reference marks −CN and −rN denote negative immittance components generated from the negative immittance converting circuit 4 as shown in equation (1). it(t) is the current through the motional impedance of the transducer 3. In equation (2), F is the external force acting on the transmitter; Ym (=1/Zm) is the motional admittance of the transducer; and $\dot{v}$ is the vibrational speed of the transducer. Y'o is the admittance at terminals c, c' looking toward the left therefrom, and Yd is the damping admittance of the transducer. If F equals zero in equation (2), v would be:

$$v(t) = (1/A) \cdot Ym/(Ym + Yd + Y'o) \cdot I = (1/A) \cdot it(t) \quad (3)$$

In order to check the response of it(t), it(t) is Laplace transformed into It(s) as follows:

$$It(s) = [V(s)/CdS] \cdot 1/[ro - rN + 1/CdS - 1/CN \cdot S] \cdot (rm + LmS + 1/CdS + 1/CmS) - 1/Cd^2S^2] \quad (4)$$

Figure 1:
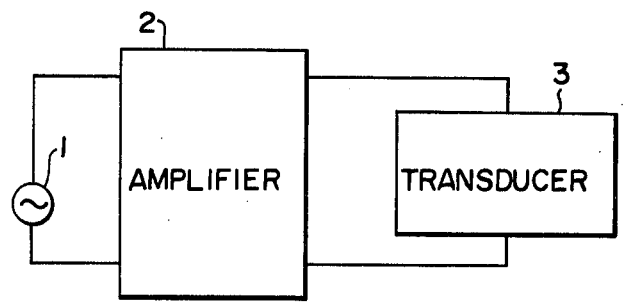
FIG. 1 is a block diagram showing a conventional method of driving the transducer in an ultrasonic wave transmitter.
Figure 2:
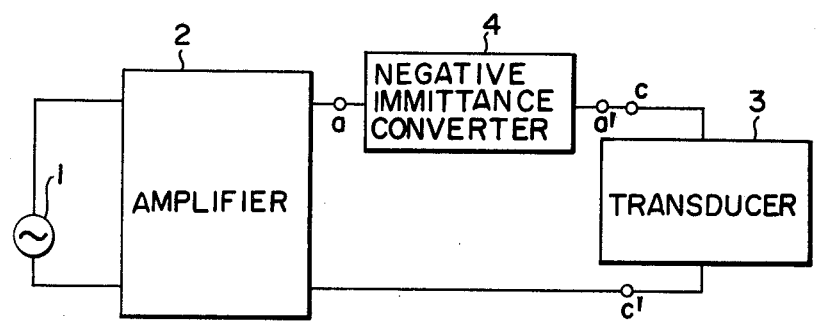
FIG. 2 is a block diagram showing a method of driving the transducer in a transmitter according to the present invention.

Assuming that the negative impedance ZNi of the negative immittance converting circuit 4 shown in FIG. 2 can be given by an equation, $$ZNi = -1/CNS - rN \quad (5)$$

ZL in FIG. 4 is set so as to satisfy the following equations in the above equation (4):

$$Cd = CN \quad (6)$$

$$ro = rN \quad (7)$$

In other words, if the combined impedance of the damping impedance of the transducer 3 and the output impedance of the amplifier may be equalized to the negative immittance of the negative immittance converting circuit 4, the equation (4) will become the following equation (8):

$$It(s) = -V(s)CdS \quad (8)$$

Figure 6:
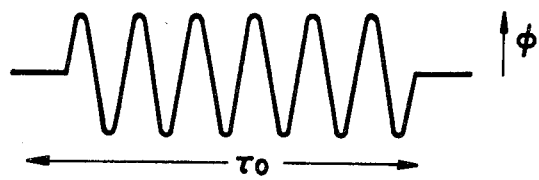
FIG. 6 is a waveform diagram showing the sine wave output of a driving amplifier, whose pulse duration is modulated.
Figure 7:
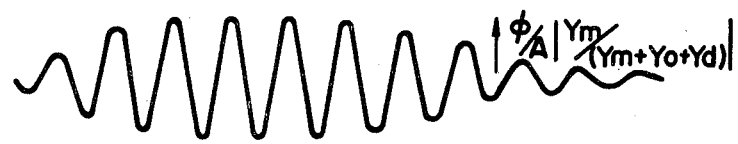
FIG. 7 is a waveform diagram showing a vibrational speed waveform of the transducer in the transmitter of FIG. 1 driven by the output of FIG. 6.

Signal V of FIG. 6 and its Laplace transformed V(s) are respectively given by the following equations (9) (10):

$$V = \phi[\sin \omega t - \sin \omega(t - \tau o) \cdot h(t - \tau o)] \quad (9)$$

$$V(s) = \phi \cdot [\omega/(S^2 + \omega^2)] \cdot (1 - e^{-\tau oS}) \quad (10)$$

In the equations (9) (10), $\phi$ is the amplitude of the driving signal; $\omega$ is the angular frequency; $\tau o$ is the pulse length; and h(t−τo) is a time shift function. From the equations (10) and (8), It(s) is given by the following equation (11):

$$It(s) = -\omega Cd \cdot \phi[S/(S^2 + \omega^2)] \cdot (1 - e^{-\tau oS}) \quad (11),$$

and the vibrational speed $\dot{v}(s)$ of the transducer 3 is given by the following equation (12), which is returned by an inversed Laplace transformation so as to return the coordinate axis thereof into a time axis, and to obtain the following equation (13):

$$\dot{v}(s) = -\omega Cd(\phi/A) \cdot [S/(S^2 + \omega^2)] \cdot (1 - e^{-\tau oS}) \quad (12)$$

$$\dot{v}(t) = -\omega Cd(\phi/A) \cdot [\cos \omega t - \cos \omega(t - \tau o)h(t - \tau o)] \quad (13)$$

Figure 8:
FIG. 8 is a vibrational speed waveform according to the present invention.

FIG. 8 is a vibrational speed waveform according to the present invention. From this waveform it will be realized that complete damping is made by the present invention.

Figure 9:
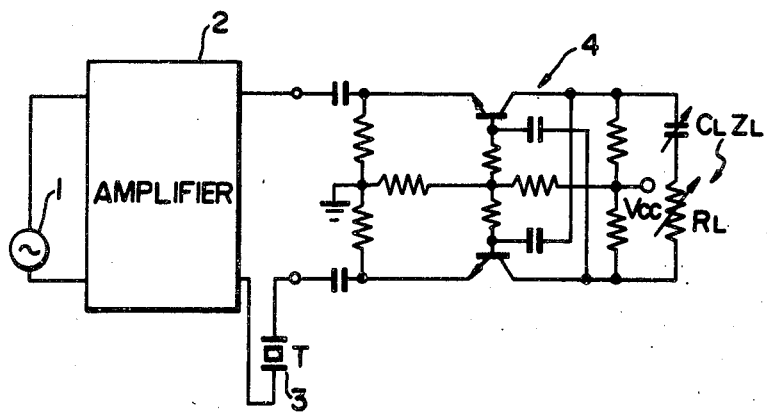
FIG. 9 is a circuit diagram of an embodiment of the transmitter according to the present invention.

In FIG. 9, one embodiment according to the present invention is shown, wherein the same reference numerals denote identical parts in the former figures. In the figure ZL denotes the load of the negative immittance converting circuit 4. This circuit includes two transistors and positive feedback is applied thereto. The negative immittance converting circuit 4 therein is of the open circuit stable type.

As explained above in detail, according to the method of this invention the output impedance of the amplifier 2 and the damping impedance of the transducer 3 are cancelled by the negative immittance generated from the negative immittance converting circuit 4. Thus, ideal damping characteristics are obtained in the relatively wide frequency range, and the damping characteristics of the transducer are much improved. When the transmitter is used for ultrasonic wave measuring, its effect is notable. The transmitter as above explained may be applied not only for measuring or communication, but also for any ultrasonic wave generator.

An explanation is now provided for the case of an ultrasonic wave receiver, using FIGS. 10 through 18.

Figure 10:
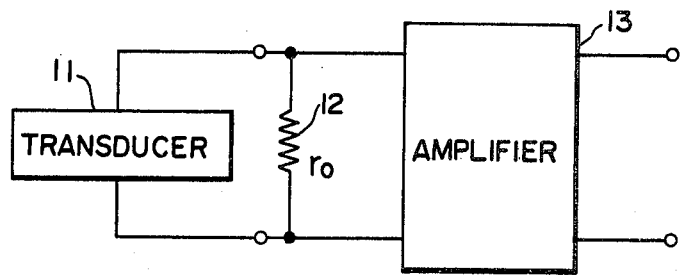
FIG. 10 is a block diagram showing a conventional receiver.
Figure 11:
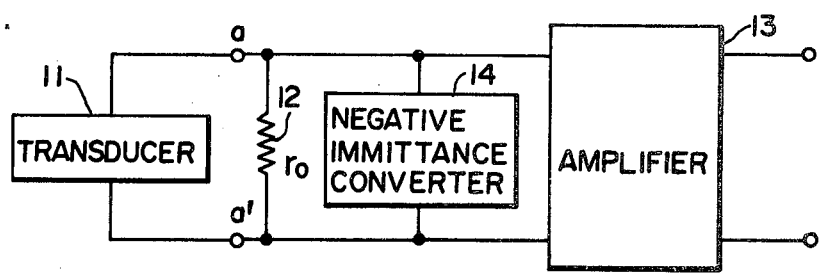
FIG. 11 is a block diagram showing a receiver according to the present invention.

In FIG. 10 showing a block diagram of a conventional ultrasonic wave receiver, 11 denotes an ultrasonic transducer (hereinafter referred to as "transducer"); 12 denotes a damping resistor; and the numeral 13 a presignal amplifier. FIG. 11 shows the construction of the receiver according to the present invention, in which the numeral 14 is a negative immittance converting circuit.

Figure 12:
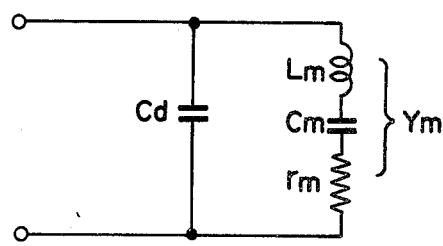
FIG. 12 is an equivalent circuit of a transducer of the electro-strictive type.

In FIG. 12 showing an equivalent circuit diagram of the electro-strictive transducer 11, Cd is the damping capacitance; Lm is the equivalent inductance of the transducer 11; Cm is the equivalent capacitance of the transducer 11; and rm is the equivalent resistance thereof. If the equivalent mass of the transducer is M; the equivalent stiffness thereof is S; its equivalent mechanical resistance including an acoustic radiation resistance is RM; and the force factor of the transducer is A; Lm, Cm and rm are given by the following definitions:

$Lm \equiv M/A^2$
$Cm \equiv A^2/S$
$rm \equiv RM/A^2$.

Figure 13:
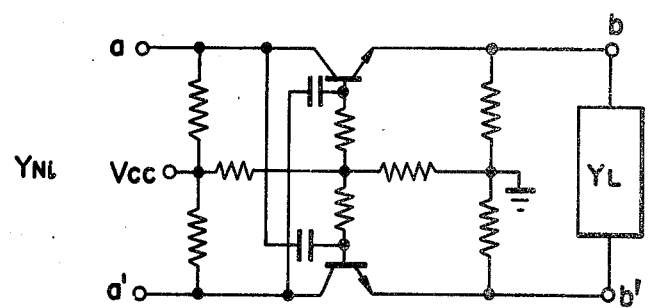
FIG. 13 is a circuit diagram showing an example of a negative immittance converter used in the receiver of the present invention.

In FIG. 13, an example of the negative immittance converting circuit 14 is shown. The following equation (14) is valid between an input admittance YNi of the negative immittance converting circuit 14 looking from terminals a, a' and an admittance YL connected between terminals b, b':

$$YNi = -KYL \tag{14}$$

In this equation, K is a positive constant determined by the circuit constant of the converting circuit 14. The converting circuit 14 shown in this figure is of the short circuit stable type.

Figure 14:
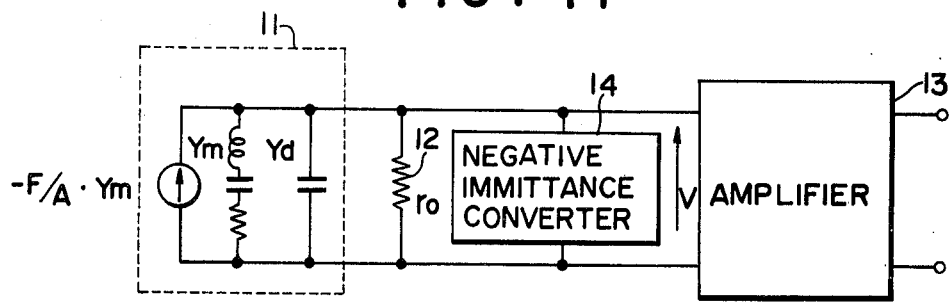
FIG. 14 is a circuit diagram showing an operational model of the receiver according to the present invention.

An explanation is now given of the damping effect of the transducer of this invention in its receiving state. FIG. 14 shows an operation model of the receiver, in which the basic equations of electric-mechanical conversion are given as follows:

$$\left. \begin{array}{l} F = -AV + A^2/Ym \cdot v \\ I = (Yo + Yd)V + A \cdot v \end{array} \right\} \tag{15}$$

The receiving output V of the receiver is given by setting I of the equation (15) as zero as follows:

$$V = -(F/A) \cdot Ym/(Ym+Yo+Yd) \tag{16}$$

In this equation, F is the mechanical input; Ym is the motional admittance of the transducer 11 given as 1/Zm; and Yo is the admittance looking from the terminals a, a' to the right in FIG. 11. In FIG. 14, the part enclosed by the dotted line marked as 11 is an equivalent circuit of the transducer 11 in its receiving state; and V is the output voltage of the receiver.

In order to see the response state of the output voltage of the receiver, a Laplace transformation is made based on FIG. 14 to get V, which is given by the following equation (17):

$$V(s) = -(F(s)/A) \cdot Ym(s)/[Ym(s)+Yo(s)+Yd(s)] \tag{17}$$

If an admittance of Yo is set as Y'o (s), Yo is then given from Y'o(s) and an admittance YNi(s) of the negative immittance converting circuit 14 as follows:

$$Yo(s) = Y'o(s) + YNi(s) \tag{18}$$

From this equation, equation (17) is amended into the following equation:

$$V(s) = -(F(s)/A) \cdot Ym(s)/[Ym(s)+Y'o(s)+YNi(s)+Yd(s)] \tag{19}$$

In the equation (19), if following equation (20) may be satisfied, the above equation (19) will be as the following equation (21):

$$Y'o(s) + YNi(s) + Yd(s) = 0 \tag{20}$$

$$V(s) = -F(s)/A \tag{21}$$

The next equation (22) shows a comparison between the wave receiving sensitivity of the conventional receiver and the receiver of this invention.

$$G = 1 + |(Yo+Yd)/Ym| \tag{22}$$

As is given above, the output voltage, namely the receiving output response of the ultrasonic wave receiver of this invention is far better compared with the conventional mechanical input signal, and accordingly the wave receiving sensitivity is also much improved.

A further explanation will be given as to the condition to satisfy equation (20). Assuming that YL of equation (14), as shown in FIG. 13, is a parallel admittance of RL and CL, equation (20) is satisfied when the following equations (23) (24) are valid:

$$ro = RL/K \tag{23}$$

$$Cd = KCL \tag{24}$$

In this condition, the output V(t) is obtained by an inverse Laplace transformation of the equation (21) as follows:

$$V(t) = -F(t)/A \tag{25}$$

Figure 15:
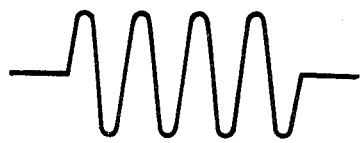
FIG. 15 is a waveform diagram showing the input signal F(t) of the receiver.
Figure 16:
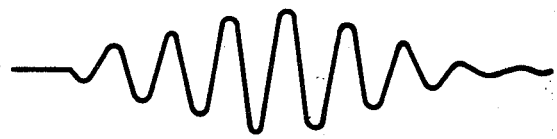
FIG. 16 is a waveform diagram showing an output waveform of the receiver according to a conventional method.
Figure 17:
FIG. 17 is a waveform diagram showing an output waveform of the receiver according to the present invention.

FIG. 15 is a waveform diagram of the input signal F(t) of the receiver. FIGS. 16 and 17 are respectively receiver output waveforms of the conventional method and of the present invention. From these figures, it will be well understood that the method of this invention can completely improve the transient response characteristics.

Figure 18:
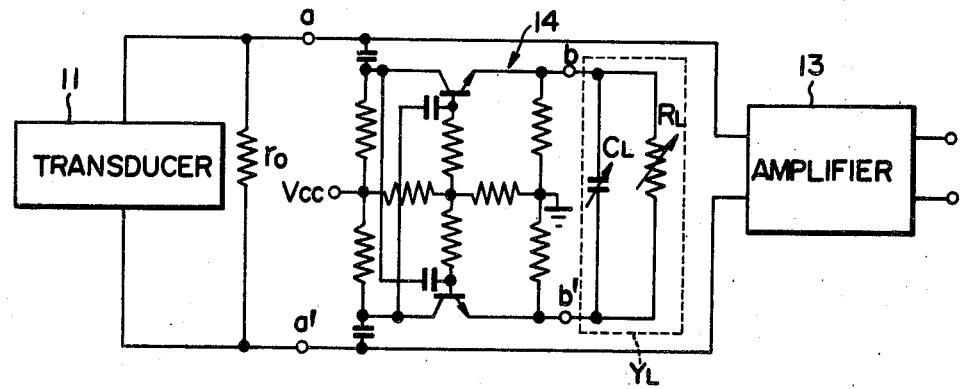
FIG. 18 is a circuit diagram showing an embodiment of the receiver according to the present invention.

In FIG. 18 showing one embodiment of the present invention, the same numerals denote identical parts referred to in the former figures. In this figure, YL denotes the load admittance of the negative immittance converting circuit 14 formed by the parallel circuit of RL and CL. This circuit includes two transistors and positive feedback is applied thereto. The circuit 14 is of the short circuit stable type.

As is fully explained above, according to the present invention the damping admittance of the transducer 11 and an admittance connected to the transducer 11 from outside are completely cancelled by the negative admittance generated from the negative immittance converting circuit 14. Thus, even when a transducer 11 of relatively high Q is used as an ultrasonic wave energy receiver component, good response and receiving sensitivity may be obtained.

Compared with the conventional method, the characteristics of this invention is thus significant, and so when used in a receiver for measuring, such will be possible for a wider range of usage, which has been conventionally impossible or at least difficult.

The invention has been described in detail with particular reference to preferred embodiments thereof, but it will be understood that variations and modifications can be effected within the spirit and scope of this invention.

What I claim is:

1. In an ultrasonic wave transmitter comprising a signal generator, an amplifier for amplifying the output of the signal generator, and an ultrasonic transducer driven by the amplifier; a method for damping the ultrasonic transducer by inserting a negative immittance converter between the amplifier and the ultrasonic transducer so as to generate a negative immittance to cancel components which impede the damping characteristics of the ultrasonic transducer including the output impedance of the amplifier, the damping impedance of the ultrasonic transducer and the connecting impedance between the amplifier and the ultrasonic transducer.

2. A method for damping an ultrasonic transducer in an ultrasonic wave transmitter according to claim 1, wherein the negative immittance converter is of an open circuit stable negative immittance converter.

3. In an ultrasonic wave receiver comprising an ultrasonic transducer and a pre-signal amplifier amplifying the output of the ultrasonic transducer; a method for damping the ultrasonic transducer by inserting a negative immittance converter between the ultrasonic transducer and the amplifier so as to generate a negative immittance to cancel components which impede the damping characteristics of the ultrasonic transducer including the damping impedance of the ultrasonic transducer, the input impedance of the pre-signal amplifier and the connecting impedance between the pre-signal amplifier and the ultrasonic transducer.

4. A method for damping an ultrasonic transducer in an ultrasonic wave receiver according to claim 3, wherein the negative immittance converter is of a short circuit stable negative immittance converter.

* * * * *